(12) United States Patent
Kim et al.

(10) Patent No.: US 9,928,896 B1
(45) Date of Patent: Mar. 27, 2018

(54) REFRESH CONTROL DEVICE

(71) Applicant: SK hynix Inc., Icheon-si Gyeonggi-do (KR)

(72) Inventors: Dae Suk Kim, Icheon-si (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/496,207

(22) Filed: Apr. 25, 2017

(30) Foreign Application Priority Data

Sep. 26, 2016 (KR) ........................ 10-2016-0123184

(51) Int. Cl.
| | | |
|---|---|---|
| *G11C 7/00* | (2006.01) | |
| *G11C 11/406* | (2006.01) | |
| *G06F 1/24* | (2006.01) | |
| *G06F 1/08* | (2006.01) | |

(52) U.S. Cl.
CPC .......... *G11C 11/40615* (2013.01); *G06F 1/08* (2013.01); *G06F 1/24* (2013.01)

(58) Field of Classification Search
CPC ............ G11C 11/406; G11C 11/40615; G11C 11/4061; G11C 11/40618; G11C 2211/4067
USPC ........................................... 365/222, 189.05
See application file for complete search history.

(56) References Cited

U.S. PATENT DOCUMENTS

| | | | | |
|---|---|---|---|---|
| 5,943,280 | A * | 8/1999 | Tsukamoto | ............ G11C 29/50 365/222 |
| 6,618,314 | B1 * | 9/2003 | Fiscus | ................... G11C 11/406 365/222 |
| 7,164,614 | B2 * | 1/2007 | Kim | ...................... G11C 11/406 365/222 |
| 9,093,173 | B1 | 7/2015 | Cha | |
| 2016/0133314 | A1 | 5/2016 | Hwang et al. | |

* cited by examiner

*Primary Examiner* — Son Dinh
(74) *Attorney, Agent, or Firm* — Williams Park & Associates Ltd.

(57) ABSTRACT

A refresh control device may include a first oscillator configured to generate a first oscillation signal, a second oscillator configured to generate a second oscillation signal having a different cycle from the first oscillation signal, a first address controller configured to latch an address in response to the first oscillation signal, and output the latched address when a refresh signal is enabled. The refresh control device may also include a second address controller configured to latch the address in response to the second oscillation signal, and output the latched address when the refresh signal is enabled. Further included may be a selector configured to select any one of the output of the first address controller and the output of the second address controller in response to a select signal, and output the selected output as a row hammer address.

20 Claims, 14 Drawing Sheets

REFRESH CONTROL DEVICE

CROSS-REFERENCES TO RELATED APPLICATION

The present application claims priority under 35 U.S.C. § 119(a) to Korean application number 10-2016-0123184, filed on Sep. 26, 2016, in the Korean Intellectual Property Office, which is incorporated herein by reference in its entirety.

BACKGROUND

1. Technical Field

Various embodiments relate to a refresh control device, and more particularly, to a technique for overcoming row hammering.

2. Related Art

With the increase in integration density of memories, a pitch between word lines included in a memory has been reduced. The reduction of the pitch between word lines has increased a coupling effect between adjacent word lines.

Whenever data is inputted to or outputted from a memory cell, a word line toggles between an active state and an inactive state. However, the above-described increase in coupling effect between adjacent word lines may damage data of a memory cell coupled to a word line adjacent to a word line which is frequently activated.

Such a phenomenon is referred to as word line disturbance. Word line disturbance may damage data of a memory cell before the memory cell is refreshed.

SUMMARY

Various embodiments are directed to a refresh control device capable of generating a row hammer address through a plurality of oscillators having different cycles, thereby reducing a refresh fail.

In an embodiment of the present disclosure, a refresh control device may include: a first oscillator configured to generate a first oscillation signal; a second oscillator configured to generate a second oscillation signal having a different cycle from the first oscillation signal; a first address controller configured to latch an address in response to the first oscillation signal, and output the latched address when a refresh signal is enabled; a second address controller configured to latch the address in response to the second oscillation signal, and output the latched address when the refresh signal is enabled; and a selector configured to select any one of the output of the first address controller and the output of the second address controller in response to a select signal, and output the selected output as a row hammer address.

BRIEF DESCRIPTION OF THE DRAWINGS

Features, aspects, and embodiments are described in conjunction with the attached drawings, in which.

DETAILED DESCRIPTION

Hereinafter, a refresh control device according to the present disclosure will be described below with reference to the accompanying drawings through exemplary embodiments.

Figure 1:
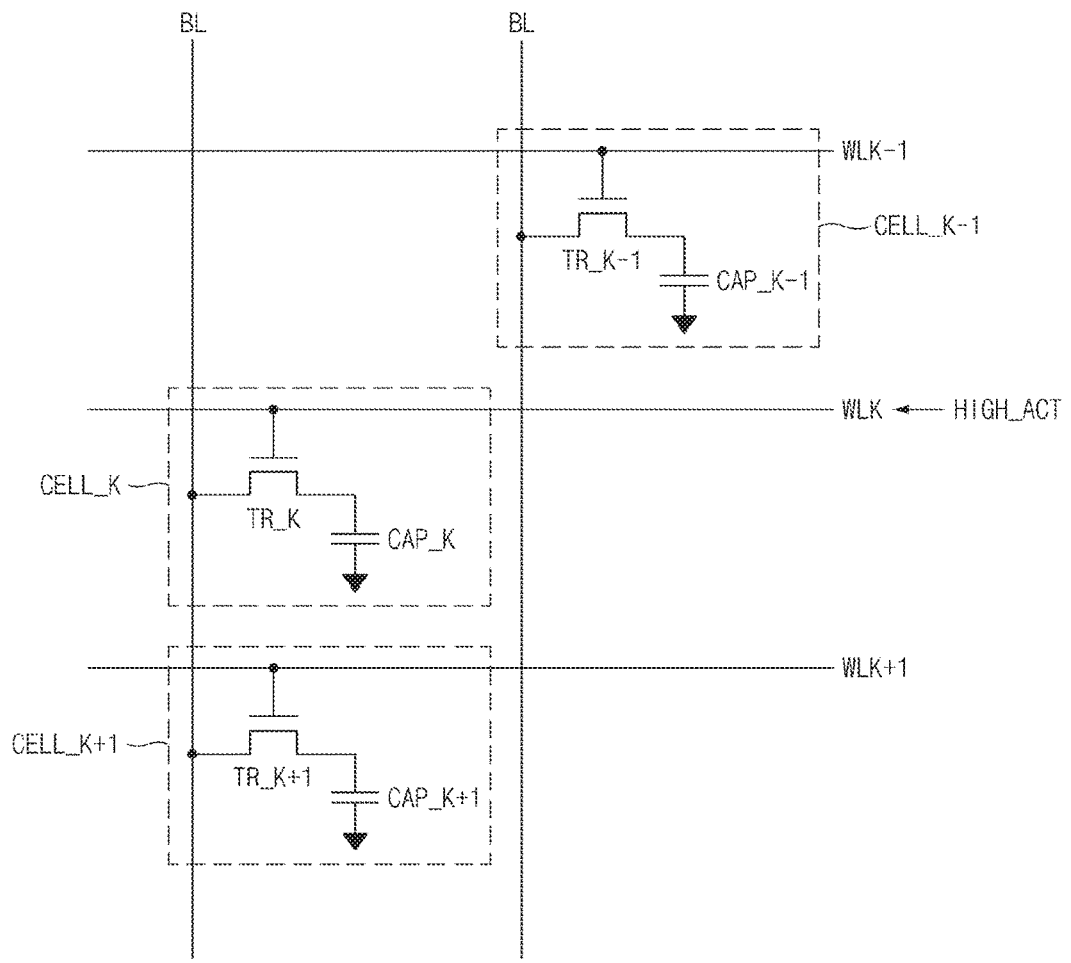
FIG. 1 is a diagram for describing word line disturbance, illustrating a part of a cell array included in a memory device.

FIG. 1 is a diagram for describing word line disturbance, illustrating a part of a cell array included in a memory device.

In FIG. 1, 'WLK' represents a word line which is frequently activated, and 'WLK−1' and 'WLK+1' represent word lines adjacent to the word line WLK. Furthermore, 'CELL_K' represents a memory cell coupled to the word line WLK, 'CELL_K−1' represents a memory cell coupled to the word line WLK−1, and 'CELL_K+1' represents a memory cell coupled to the word line WLK+1. The memory cells include cell transistors TR_K, TR_K−1 and TR_K+1 and cell capacitors CAP_K, CAP_K−1 and CAP_K+1, respectively.

In FIG. 1, when the word line WLK is activated or deactivated, a coupling effect may occur between the word line WLK and the word lines WLK−1 and WLK+1, thereby affecting charges of the cell capacitors CAP_K, CAP_K−1 and CAP_K+1 while the voltages of the word lines WLK−1 and WLK+1 are raised or lowered.

Thus, when the word line WLK is frequently activated to toggle between an active state and an inactive state, the charges of the cell capacitors CAP_K−1 and CAP_K+1 included in the memory cells CELL_K−1 and CELL_K+1 may be significantly changed, and data of the memory cells may deteriorate.

Furthermore, electromagnetic waves generated while a word line toggles between an active state and an inactive state may introduce electrons into the cell capacitor of a memory cell coupled to an adjacent word line or leak electrons from the cell capacitor, thereby damaging data of the memory cell.

When a specific word line (for example, WLK) is repetitively activated a predetermined number of times or more, data of memory cells coupled to the adjacent word lines (for example, WLK+1 and WLK−1) may deteriorate. Such a phenomenon is referred to as row hammering. In order to solve this problem, an active operation may be performed on the word lines WLK+1 and WLK−1 adjacent to the word line WLK which is excessively activated.

As the active operation is performed on the adjacent word lines WLK+1 and WLK−1, the data of the memory cells coupled to the adjacent word lines WLK+1 and WLK−1 may be rewritten, which makes it possible to prevent damage of the data.

A semiconductor device such as a DRAM includes an enormous number of memory cells, and each of the memory cells includes a transistor serving as a switch and a capacitor for storing data. However, since a leakage current may occur due to a structural problem of a memory cell such as a PN junction of the transistor, the initial data stored in the capacitor may disappear. Thus, the semiconductor device requires a refresh operation of recharging the memory cell before the data disappears.

A normal refresh operation may include an auto refresh operation and a self refresh operation. The auto refresh operation refers to a mode in which a semiconductor device performs a refresh operation according to a refresh command applied from outside the semiconductor device, and the self refresh operation refers to a mode in which a semiconductor device performs a refresh operation while sequentially changing an internal address according to a refresh command applied from outside the semiconductor device.

Recently, in addition to the normal refresh operation, an additional refresh operation is performed on a row which is highly likely to lose data due to row hammering. Row hammering refers to a phenomenon in which data of memory cells coupled to a corresponding row or adjacent rows are damaged because the corresponding row is frequently activated.

The refresh control device according to the present embodiment can randomize a target address which is accessed for an additional refresh operation, through a plurality of oscillators having difference cycles, thereby reducing a refresh failure.

Figure 2:
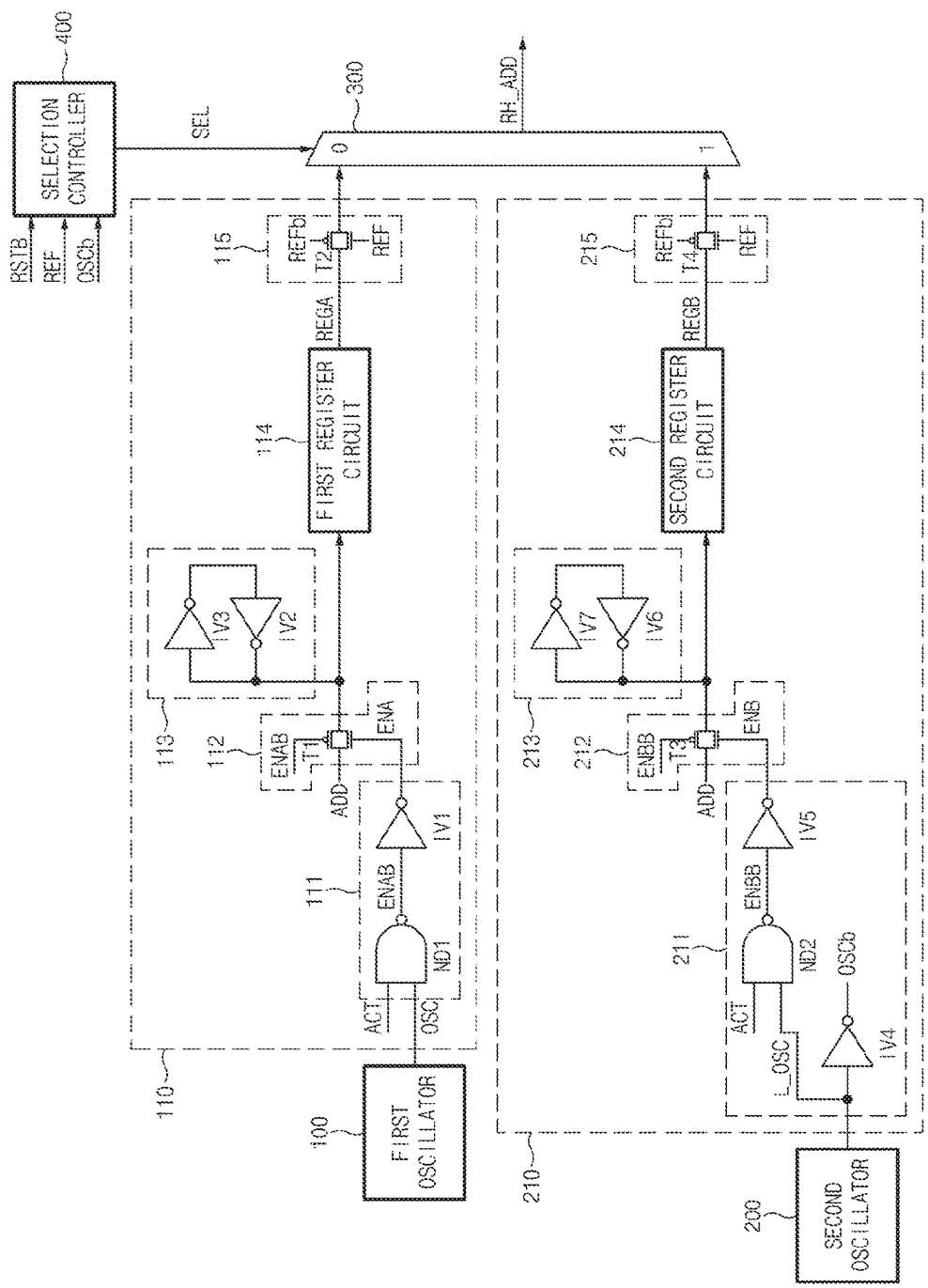
FIG. 2 is a configuration diagram of a refresh control device according to an embodiment.

FIG. 2 is a configuration diagram of a refresh control device according to an embodiment.

The refresh control device according to the present embodiment includes a first oscillator 100, a first address controller 110, a second oscillator 200, a second address controller 210, a selector 300, and a selection controller 400.

The first address controller 110 includes an enable control circuit 111, an address input circuit 112, a latch circuit 113, a first register circuit 114, and an address output circuit 115. The second address controller 210 includes an enable control circuit 211, an address input circuit 212, a latch circuit 213, a second register circuit 214, and an address output circuit 215.

The first oscillator 100 generates an oscillation signal OSC having a constant cycle in order to perform a refresh operation. The enable control circuit 111 combines an active signal ACT and the oscillation signal OSC and generates an enable signal ENA.

When both the active signal ACT and the oscillation signal OSC are enabled, the enable control circuit 111 enables the enable signal ENA. The enable control circuit 111 includes a NAND gate ND1 and an inverter IV1. The NAND gate ND1 performs a NAND operation on the active signal ACT and the oscillation signal OSC, and outputs an enable signal ENAB. The inverter IV1 inverts the enable signal ENAB and outputs the enable signal ENA.

The address input circuit 112 selectively receives an address ADD in response to at least one of the enable signals ENA and ENAB. Thus, the first address controller 110 may latch the address ADD in response to the oscillation signal OSC. The address input circuit 112 includes a transmission gate T1. When the enable signal ENA is enabled the transmission gate T1 is turned on to receive an address ADD, and when the enable signal ENA is disabled the transmission gate T1 is turned off to block an input of the address ADD.

The latch circuit 113 latches the address ADD for a predetermined time, where the address ADD may be transmitted through the address input circuit 112. The latch circuit 113 includes inverters IV2 and IV3 having input and output terminals coupled to each other.

The first register circuit 114 stores an output address of the latch circuit 113 for a predetermined time, and outputs an address REGA. The first register circuit 114 stores the address ADD, which is output from the address input circuit 112, in synchronization with the oscillation signal OSC.

The address output circuit 115 selectively outputs the address REGA in response to at least one enabled refresh signals REF and REFB, where the address REGA is received from the first register circuit 114. The refresh signal REF is an inverted signal of the refresh signal REFB.

The address output circuit 115 includes a transmission gate T2. The transmission gate T2 outputs the address REGA when the refresh signal REF is enabled, and blocks an output of the address REGA when the refresh signal is disabled.

The second oscillator 200 generates an oscillation signal L_OSC having a constant cycle in order to perform a refresh operation. The oscillation signal L_OSC outputted from the second oscillator 200 has a different cycle from the oscillation signal OSC outputted from the first oscillator 100.

For example, the oscillation signal L_OSC may have a longer cycle than the oscillation signal OSC. In the present embodiment, the second oscillator 200 as well as the first oscillator 100 is additionally installed in order to prevent a concentration of accesses to only one specific address, during a refresh operation.

In the present embodiment, the configuration that the second oscillator 200 generates the oscillation signal L_OSC having a constant cycle has been exemplified. However, the present embodiment is not limited thereto, but the second oscillator 200 may be designed to generate the oscillation signal L_OSC having a random cycle. Furthermore, in some embodiments the oscillation signal L_OSC of the second oscillator 200 may be designed to have a shorter cycle than the oscillation signal OSC.

The enable control circuit 211 generates the enable signal ENB by combining the active signal ACT and the oscillation signal L_OSC. When both the active signal ACT and the oscillation signal L_OSC are enabled, the enable control circuit 211 enables the enable signal ENB.

The enable control circuit 211 includes a NAND gate ND2 and inverters IV4 and IV5. The NAND gate ND2 performs a NAND operation on the active signal ACT and the oscillation signal L_OSC, and outputs an enable signal ENBB. The inverter IV5 inverts the enable signal ENBB, and outputs the enable signal ENB. The inverter IV4 inverts the oscillation signal L_OSC and generates an oscillation signal OSCb.

The address input circuit 212 selectively receives the address ADD in response to at least one of the enable signals ENB and ENBB. Thus, the second address controller 210 may latch the address ADD in response to the oscillation signal L_OSC. The address input circuit 212 includes a transmission gate T3. When the enable signal ENB is enabled the transmission gate T3 is turned on to receive the address ADD, and when the enable signal ENB is disabled the transmission gate T3 is turned off to block an input of the address ADD.

The latch circuit 213 latches the address ADD for a predetermined time, where the address ADD may be transmitted through the address input circuit 212. The latch circuit 213 includes inverters IV6 and IV7 having input and output terminals coupled to each other.

The second register circuit 214 stores an output address of the latch circuit 213 for a predetermined time, and outputs an address REGB. The second register circuit 214 stores the address ADD, which is output from the address input circuit 212, in synchronization with the oscillation signal L_OSC.

The address output circuit 215 selectively outputs the address REGB in response to at least one enabled refresh signals REF and REFB, where the address REGB is received from the second register circuit 214. The address output circuit 215 includes a transmission gate T4. The transmission gate T4 outputs the address REGB when the refresh signal REF is enabled, and blocks an output of the address REGB when the refresh signal REF is disabled.

The selector 300 selects any one output of the first address controller 110 and the second address controller 210 in response to a select signal SEL, and the selector 300 outputs the selected output as a row hammer address RH_ADD. For example, when the select signal SEL is at a logic low level, the selector 300 selects the output of the address output circuit 115, and outputs the selected output as the row hammer address RH_ADD. On the other hand, when the select signal SEL is at a logic high level, the selector 300 selects the output of the address output circuit 215, and outputs the selected output as the row hammer address RH_ADD.

The selection controller 400 generates the select signal SEL in response to a reset signal RSTB, a refresh signal REF and the oscillation signal OSCb.

Figure 3:
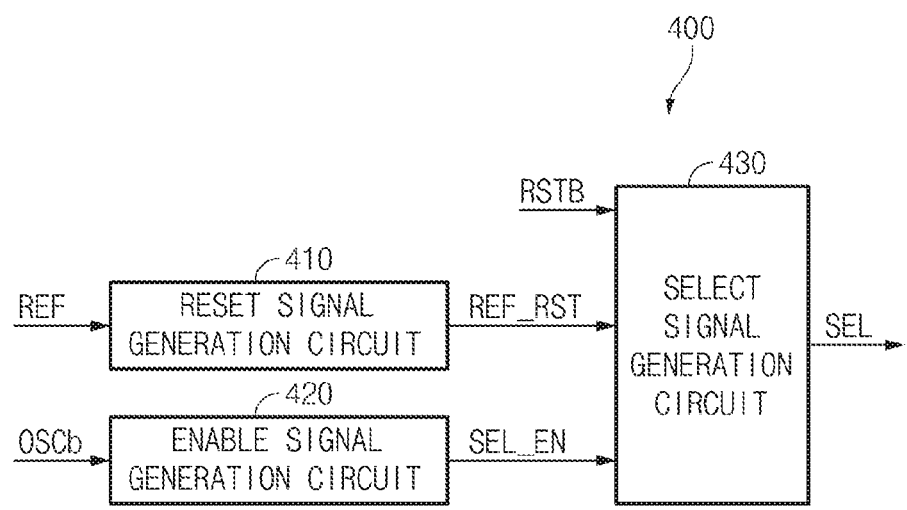
FIG. 3 is a detailed configuration diagram of a selection controller of FIG. 2.

FIG. 3 is a detailed configuration diagram of the selection controller 400 of FIG. 2.

The selection controller 400 includes a reset signal generation circuit 410, an enable signal generation circuit 420, and a select signal generation circuit 430.

The reset signal generation circuit 410 generates a refresh reset signal REF_RST in response to the refresh signal REF. The enable signal generation circuit 420 generates a select enable signal SEL_EN in response to the oscillation signal OSCb. The select signal generation circuit 430 generates the select signal SEL in response to the reset signal RSTB, the refresh reset signal REF_RST, and the select enable signal SEL_EN.

Figure 4:
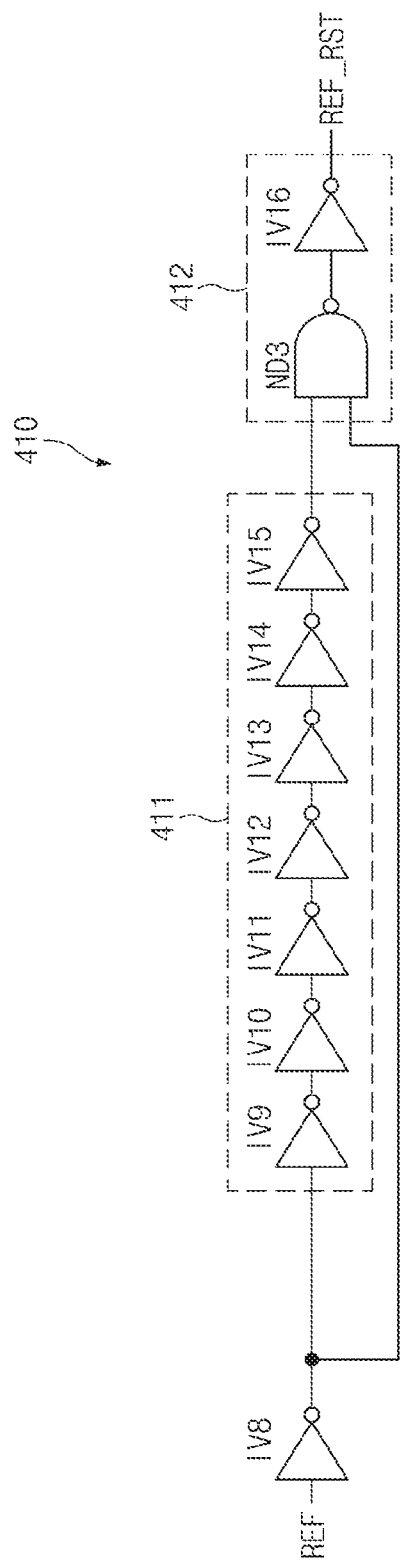
FIG. 4 is a detailed circuit diagram of a reset signal generation circuit of FIG. 3.

FIG. 4 is a detailed circuit diagram of the reset signal generation circuit 410 of FIG. 3.

The reset signal generation circuit 410 generates the refresh reset signal REF_RST having a pulse shape by delaying the refresh signal REF. The reset signal generation circuit 410 includes a delay circuit 411 and a combination circuit 412.

The delay circuit 411 inverts and delays the refresh signal REF for a predetermined time, where the refresh signal REF may be inverted by an inverter IV8. The delay circuit 411 includes a plurality of inverters IV9 to IV15 coupled in a chain structure.

The combination circuit 412 combines an output of the delay circuit 411 and the refresh signal REF inverted by the inverter IV8, and outputs the refresh reset signal REF_RST. The combination circuit 412 includes a NAND gate ND3 and an inverter IV16. The NAND gate ND3 performs a NAND operation on the output of the delay circuit 411 and the refresh signal REF inverted by the inverter IVB. The inverter IV16 inverts an output of the NAND gate ND3, and outputs the refresh reset signal REF_RST.

For example, when the refresh signal REF is enabled to a high level, the reset signal generation circuit 410 outputs the refresh signal REF_RST having a high-level pulse width for the delay time of the delay circuit 411.

Figure 5:
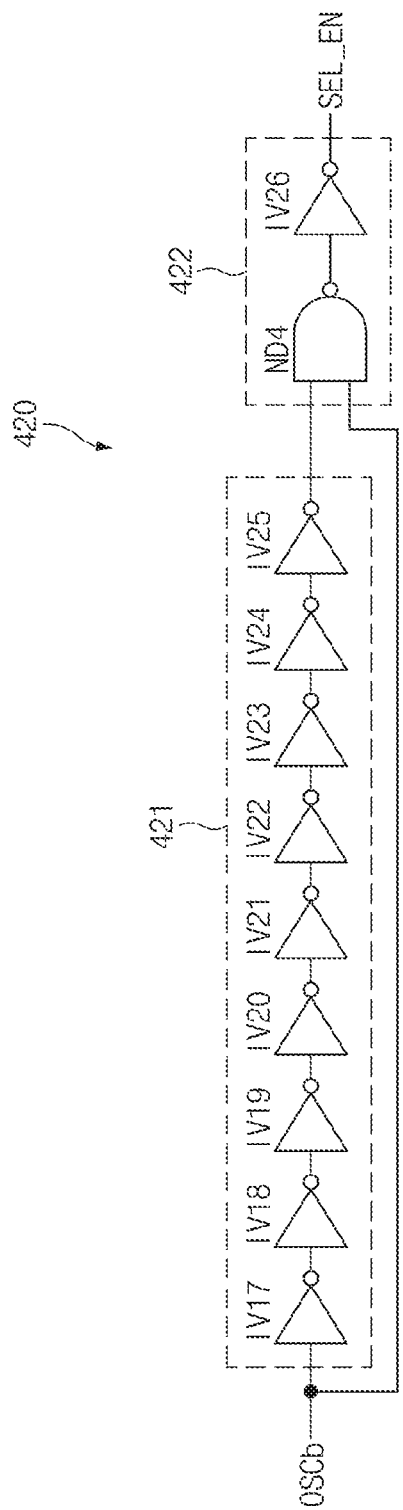
FIG. 5 is a detailed circuit diagram of an enable signal generation circuit of FIG. 3.

FIG. 5 is a detailed circuit diagram of the enable signal generation circuit 420 of FIG. 3.

The enable signal generation circuit 420 generates the select enable signal SEL_EN having a pulse shape by delaying the oscillation signal OSCb. The enable signal generation circuit 420 includes a delay circuit 421 and a combination circuit 422.

The delay circuit 421 delays the oscillation signal OSCb for a predetermined time without inverting the oscillation signal OSCb. The delay circuit 421 includes a plurality of inverters IV17 to IV25 coupled in a chain structure.

The combination circuit 422 combines an output of the delay circuit 421 and the oscillation signal OSCb, and outputs the select enable signal SEL_EN. The combination circuit 422 includes a NAND gate ND4 and an inverter IV26. The NAND gate ND4 performs a NAND operation on the output of the delay circuit 421 and the oscillation signal OSCb. The inverter IV26 inverts an output of the NAND gate ND4, and outputs the select enable signal SEL_EN.

For example, when the oscillation signal OSCb is enabled to a high level, the enable signal generation circuit 420 outputs the select enable signal SEL_EN having a high-level pulse width for the delay time of the delay circuit 421.

Figure 6:
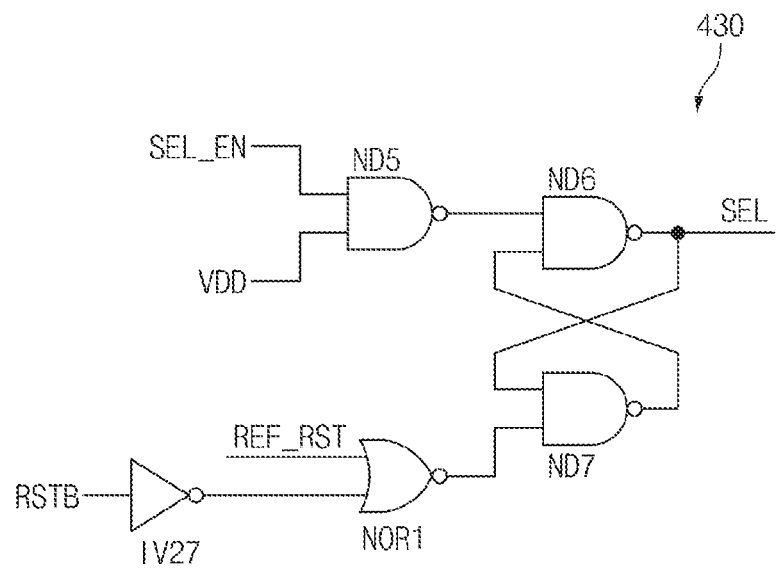
FIG. 6 is a detailed circuit diagram of a select signal generation circuit of FIG. 3.

FIG. 6 is a detailed circuit diagram of the select signal generation circuit 430 of FIG. 3.

The select signal generation circuit 430 generates the select signal SEL in response to the reset signal RSTB, the refresh reset signal REF_RST, and the select enable signal SEL_EN. The select signal generation circuit 430 includes a plurality of NAND gates ND5 to ND7, a NOR gate NOR1, and an inverter IV27.

The NAND gate ND5 performs a NAND operation on the select enable signal SEL_EN and a supply voltage VDD. The NOR gate NOR1 performs a NOR operation on the refresh reset signal REF_RST and the reset signal RSTB inverted by the inverter IV27. In one example, when the reset signal RSTB is enabled, the select signal generation circuit 430 may be activated when the select enable signal SEL_EN is enabled. Further, when the reset signal RSTB is enabled, the select signal generation circuit 430 may be deactivated when the refresh reset signal REF_RST is enabled.

The NAND gate ND6 performs a NAND operation on an output of the NAND gate ND5 and an output of the NAND gate ND7, and outputs the select signal SEL. The NAND gate ND7 performs a NAND operation on an output of the NAND gate ND6 and an output of the NOR gate NOR1.

Figure 7:
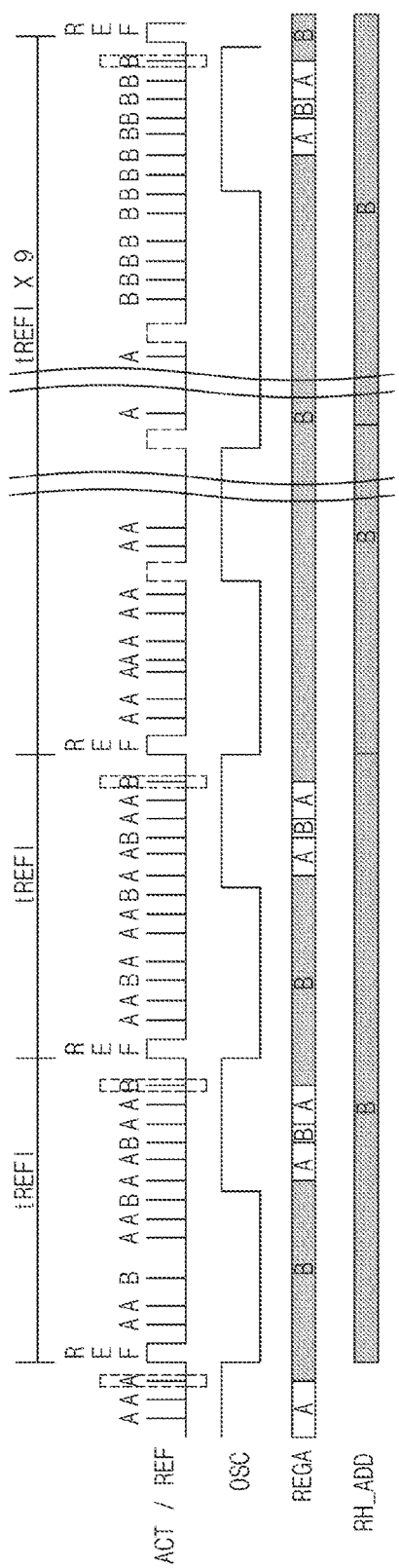
FIGS. 7 and 8 are timing diagrams for describing an operation of the refresh control device of FIG. 2.
Figure 8:
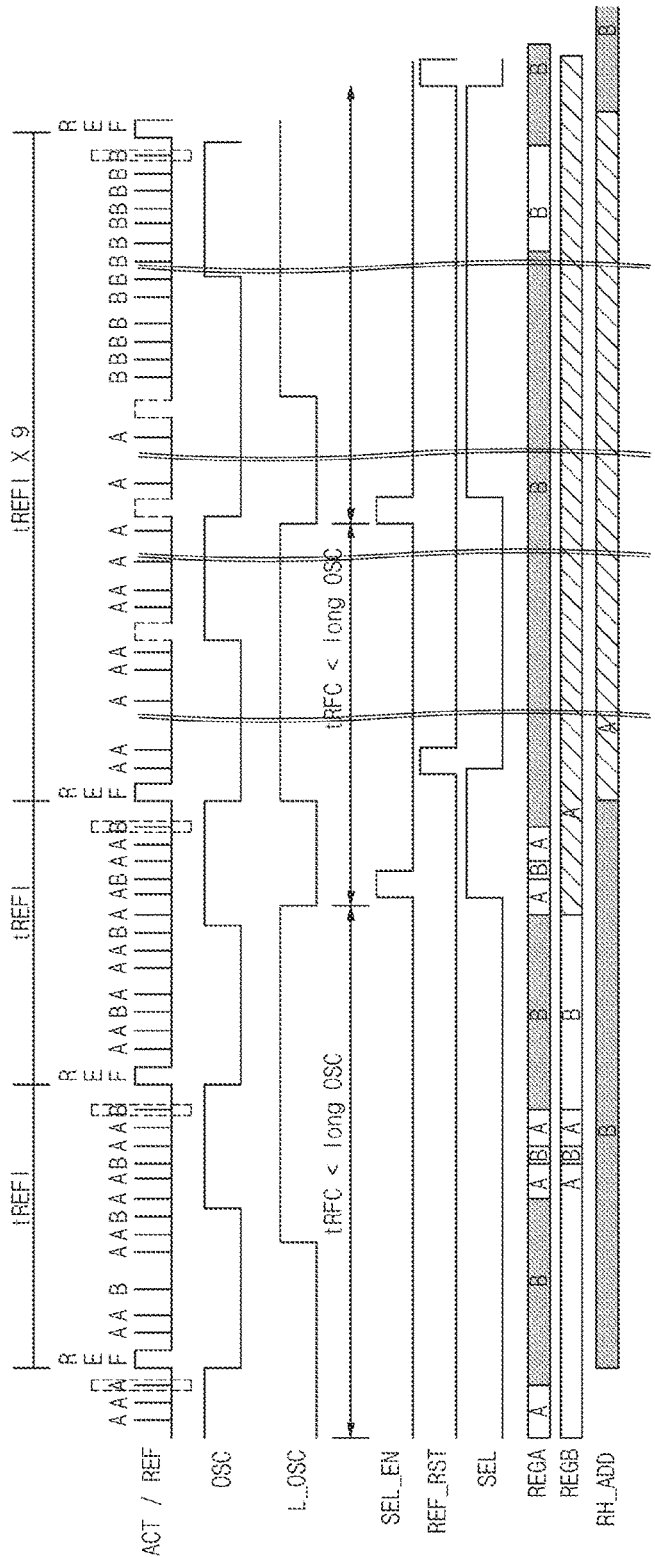

FIGS. 7 and 8 are timing diagrams for describing operation of the refresh control device of FIG. 2.

FIG. 7 is an operation timing diagram when only the first oscillator 100 is operated.

As the technology of semiconductor devices shrinks and a pitch between adjacent word lines is gradually reduced, data loss occurs because the refresh characteristics are degraded by row hammering. The phenomenon of "row hammering" refers to an instance when only a specific row line is continuously activated and precharged, a refresh failure occurs in upper and lower word lines adjacent to a target word line, and cell data of the adjacent word lines are lost.

In order to overcome row hammering, a "smart refresh" may be performed as follows. When a user repetitively activates and precharges a word line of a specific address, a specific row line which is repetitively activated is sampled, and the address of the row line is stored. Then, when the next refresh command is applied, upper and lower word lines adjacent to the specific row line are refreshed through an adder-subtracter.

As memory devices (for example, DRAM) are scaled down, data loaded on rows ((N+1)th and (N−1)th lines) around an accessed specific row (Nth line) may be lost. That is, row hammering may occur. In order to solve this problem, the first register circuit 114 latches an address ADD inputted in response to the active signal ACT. Then, in order to prevent row hammering, the refresh signal REF is enabled to perform a refresh operation on a row line adjacent to the latched address REGA.

In order to improve the efficiency of the refresh operation, the address ADD needs to be randomly stored in the first register circuit 114. For example, when two row addresses are accessed for one bank, a smart refresh operation needs to be uniformly performed on the two row addresses, in order to prevent row hammering.

However, when one oscillator, that is, the first oscillator 100 is used, the first oscillator 100 outputs the oscillation signal OSC having a specific cycle. Thus, the addresses REGA stored in the first register circuit 114 are not randomly outputted, but only one specific address may be synchronized. Then, row hammering may occur at the other addresses which are not synchronized.

For example, suppose that a first address A and a second address B are activated in response to the oscillation signal OSC. Then, the first address A and the second address B are latched, where a refresh operation is performed during an active period of the oscillation signal OSC. In this case, only one address of the first and second addresses A and B (for example, the second address B) is latched in the first register circuit 114, and a refresh operation is performed.

Suppose that the first address A is a target address. In this case, although the first address A needs to be selected and outputted as a row hammer address RH_ADD, only the second address B is selected. Thus, there is no chance that the first address A can be selected. Therefore, row hammering cannot be avoided, where row hammering is occurs on the first address A between the first and second addresses A and B.

FIG. 8 is an operating timing diagram in which both the first and second oscillators 100 and 200 are operated.

The first oscillator 100 generates an oscillation signal OSC having a constant cycle. The first register circuit 114 stores the address ADD when both the active signal ACT and the oscillation signal OSC are enabled. When the refresh signal REF is enabled, the address output circuit 115 outputs the address stored in the first register circuit 114 as the row hammer address RH_ADD. The cycle of the oscillation signal SOC may be included in tREFI.

In the present embodiment, the second oscillator 200 having a different cycle from the first oscillator 100 may be installed to more randomly latch an address, as illustrated in FIG. 8. That is, the selector 300 selects and outputs the address latched in the first register circuit 114 by the first oscillator 100, or selects and outputs the address latched in the second register circuit 214 by the second oscillator 200.

As such, when two source signals are used to generate the row hammer address RH_ADD, only one specific address is not synchronized, but a plurality of addresses may be randomly synchronized, during an active operation.

Here, tREFI represents an interval at which the refresh signal REF is enabled (refresh operation period). Furthermore, tRFC represents a time required until an active cycle is started (refresh row cycle time), that is, a minimum time required for activating and precharging a word line during a refresh operation. The oscillation signal L_OSC may have a longer cycle than tRFC.

For example, suppose that the first address A and the second address B are activated in response to the oscillation signal OSC and the oscillation signal L_OSC. Then, during a period that the select signal SEL is not enabled, the first address A is selected in synchronization with the oscillation signal OSC.

The select enable signal SEL_EN is enabled to a logic high level in synchronization with a falling edge of the oscillation signal L_OSC. The select signal SEL is enabled to a logic high level when the select enable signal SEL_EN is enabled, and disabled to a logic low level when refresh reset signal REF_RST is enabled.

When the select signal SEL is enabled, the second address B is selected in synchronization with the oscillation signal L_OSC. In this case, the first and second addresses A and B may be all latched to perform a refresh operation.

Figure 9:
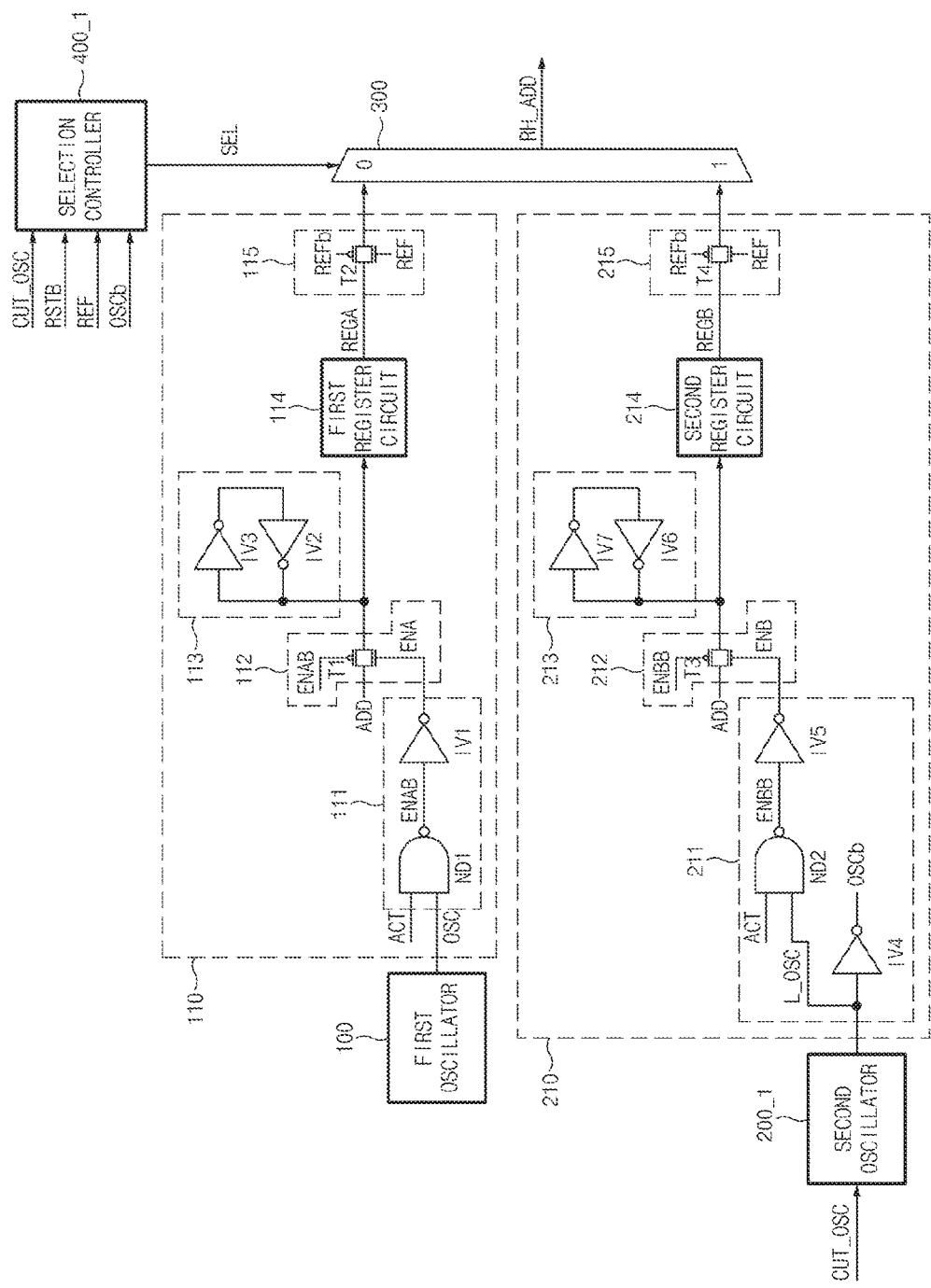
FIG. 9 is a configuration diagram of a refresh control device according to another embodiment.

FIG. 9 is a configuration diagram of a refresh control device according to another embodiment. The refresh control device according to the embodiment of FIG. 9 includes a second oscillator 200_1 and a selection controller 400_1 which have different configurations from those of the refresh control device according to the embodiment of FIG. 2.

The operation of the second oscillator 200_1 may be controlled by an oscillation stop signal CUT_OSC. That is, the second oscillator 200_1 generates the oscillation signal L_OSC at a constant cycle during an oscillation operation. When the oscillation stop signal CUT_OSC is enabled, the oscillation operation of the second oscillator 200_1 is stopped. Then, the second oscillator 200_1 does not generate the oscillation signal L_OSC anymore. The selection controller 400_1 disables the select signal SEL by force, when the oscillation stop signal CUT_OSC is enabled.

Because the other components of the embodiment of FIG. 9 are configured in substantially the same manner as those of the embodiment of FIG. 2, the detailed descriptions thereof are omitted herein.

Figure 10:
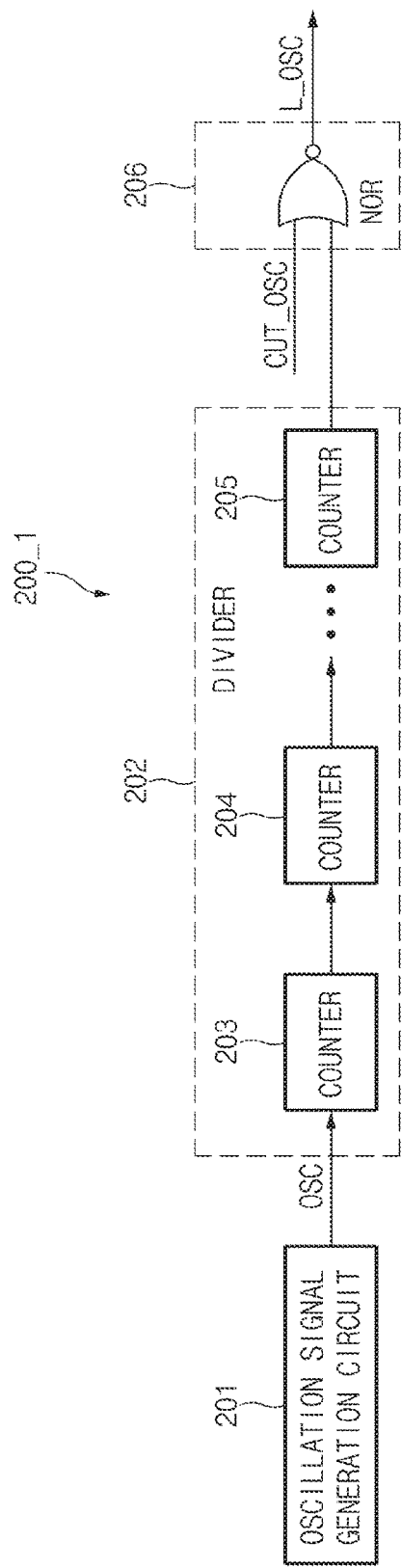
FIG. 10 is a detailed configuration diagram of a second oscillator of FIG. 9.

FIG. 10 is a detailed configuration diagram of the second oscillator 200_1 of FIG. 9.

The second oscillator 200_1 includes an oscillation signal generation circuit 201, a divider 202, and a combination circuit 206.

The oscillation signal generation circuit 201 generates an oscillation signal OSC having a constant cycle. The divider 202 generates a signal having a long cycle by dividing the oscillation signal OSC.

The divider 202 includes a plurality of counters 203 to 205. The counters 203 and 205 count the oscillation signal OSC and generate signals having double, quadruple and eightfold cycles, respectively.

The combination circuit 206 combines the oscillation stop signal CUT_OSC and an output signal of the divider 202, and outputs the oscillation signal L_OSC. The combination circuit 206 includes a NOR gate configured to perform a NOR operation on the oscillation stop signal CUT_OSC and the output signal of the divider 202.

In the embodiment of FIG. 10, the oscillation stop signal CUT_OSC is exemplified as a high pulse signal. However, the present embodiment is not limited thereto, but the oscillation stop signal CUT_OSC may include a pulse signal with a random cycle.

Figure 11:
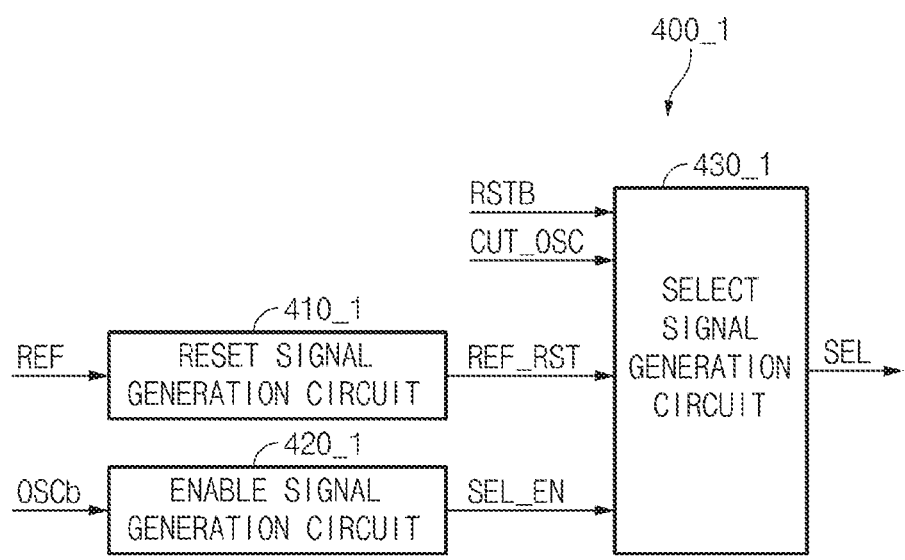
FIG. 11 is a detailed configuration diagram of a selection controller of FIG. 9.

FIG. 11 is a detailed configuration diagram of the selection controller 400_1 of FIG. 9.

The selection controller 400_1 includes a reset signal generation circuit 410_1, an enable signal generation circuit 420_1, and a select signal generation circuit 430_1.

The reset signal generation circuit 410_1 generates a refresh reset signal REF_RST in response to a refresh signal REF. The enable signal generation circuit 420_1 generates a select enable signal SEL_EN in response to an oscillation signal OSCb. The select signal generation circuit 430_1 generates a select signal SEL in response to a reset signal RSTB, a refresh reset signal REF_RST, the select enable signal SEL_EN, and the oscillation stop signal CUT_OSC.

Figure 12:
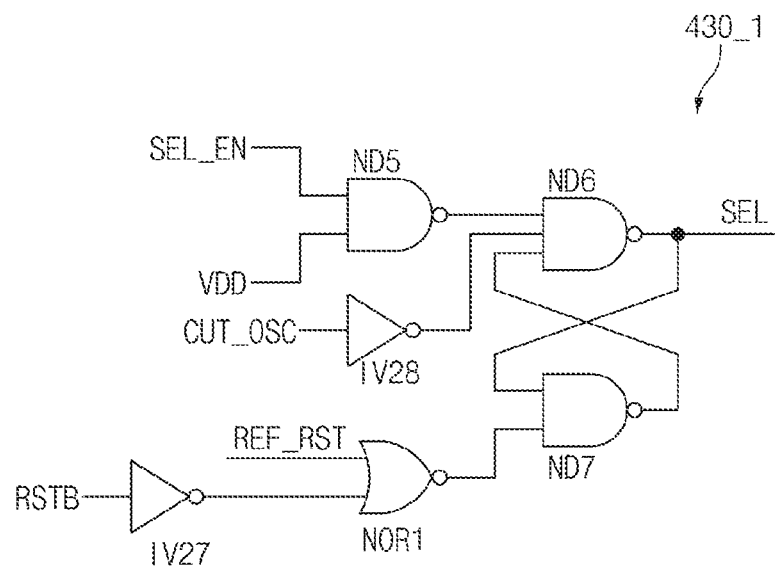
FIG. 12 is a detailed circuit diagram of a select signal generation circuit of FIG. 11.

FIG. 12 is a detailed circuit diagram of the select signal generation circuit 430_1 of FIG. 11. The embodiment of FIG. 12 further includes an inverter IV28 configured to invert and drive the oscillation stop signal CUT_OSC, compared to the embodiment of FIG. 6.

The second oscillator 200_1 may disable the oscillation signal L_OSC when the oscillation stop signal CUT_OSC is enabled. The select signal generation circuit 430_1 disables the select signal SEL in response to the oscillation stop signal CUT_OSC.

Figure 13:
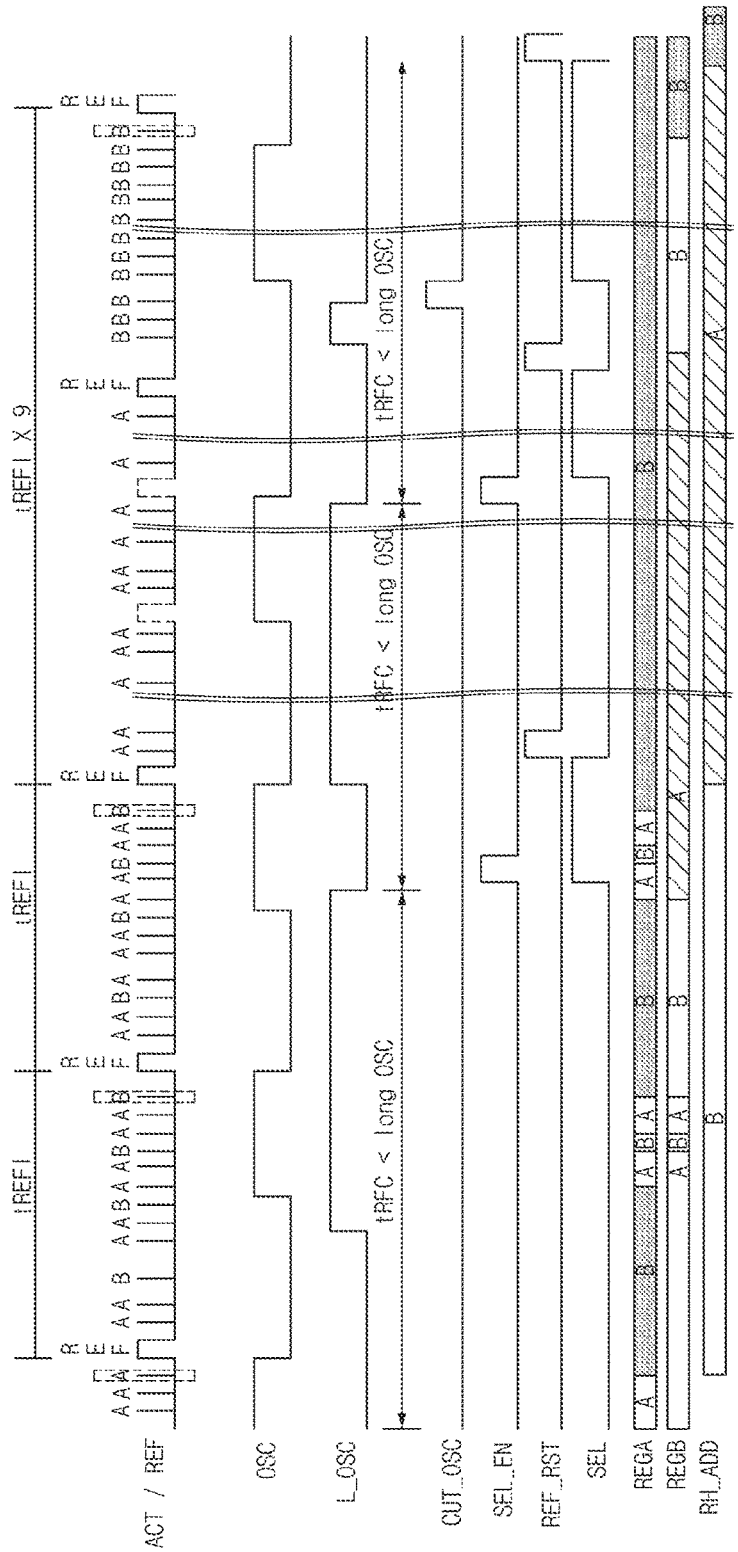
FIG. 13 is a timing diagram for describing an operation of the refresh control device of FIG. 9.

FIG. 13 is an operation timing diagram of the refresh control device of FIG. 9.

Referring to FIG. 13, the oscillation signal L_OSC is disabled to a logic low level when the oscillation stop signal CUT_OSC is enabled, and the select signal generation circuit 430_1 may enable the select signal SEL when the oscillation stop signal CUT_OSC is disabled. Then, the selector 300 does not select an output of the second register circuit 214, but selects the first address A which is an output of the first register circuit 114.

According to the present embodiment, the refresh control device can improve the reliability of memory cells by reducing a refresh fail.

While certain embodiments have been described above, it will be understood to those skilled in the art that the embodiments described are by way of example only. Accordingly, the refresh control device described herein should not be limited based on the described embodiments. Rather, the refresh control device described herein should only be limited in light of the claims that follow when taken in conjunction with the above description and accompanying drawings.

Figure 14:
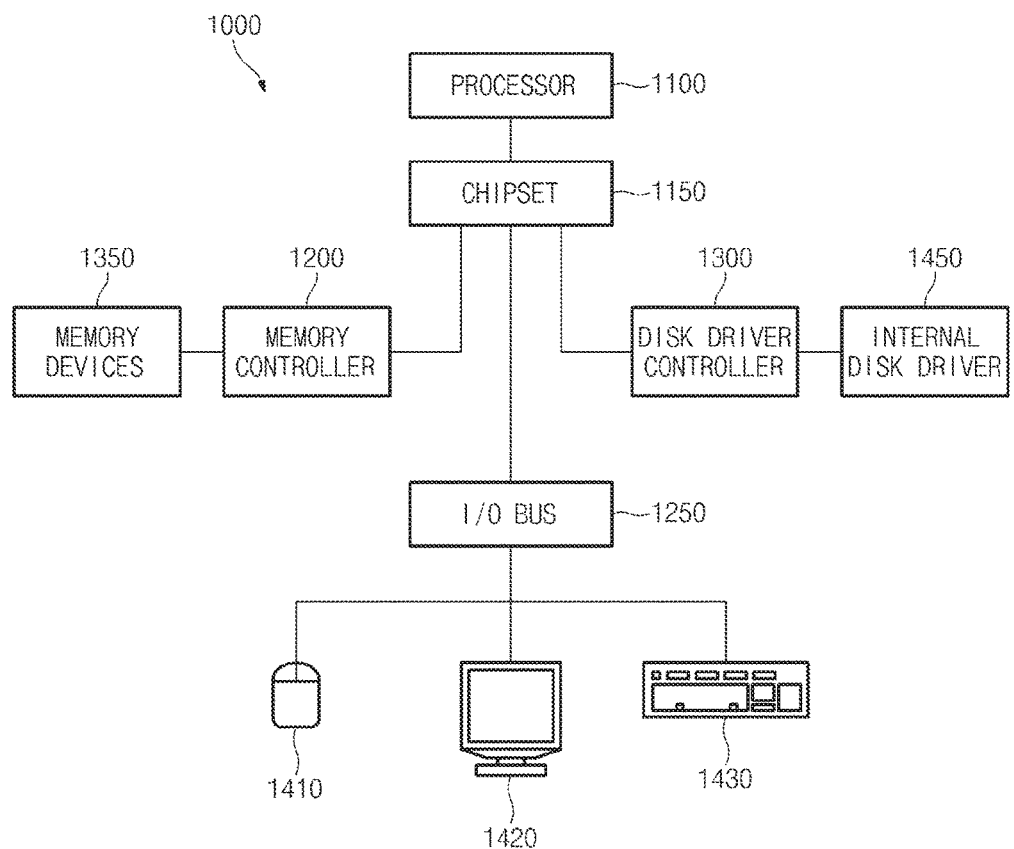
FIG. 14 illustrates a block diagram of an example representation of a system employing a semiconductor device in accordance with the various embodiments discussed above with relation to FIGS. 1-13.

The semiconductor devices and/or a cell array discussed above (see FIGS. 1-13) are particularly useful in the design of memory devices, processors, and computer systems. For example, referring to FIG. 14, a block diagram of a system employing a semiconductor device and/or a cell array in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or cell array as discussed above with reference to FIGS. 1-13. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or cell array as discussed above with relation to FIGS. 1-13, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 14 is merely one example of a system 1000 employing a semiconductor device and/or a cell array as discussed above with relation to FIGS. 1-13. In alternate embodiments, such as, for example but not limited to, cellular phones or digital cameras, the components may differ from the embodiments illustrated in FIG. 14.

What is claimed is:
1. A refresh control device comprising:
 a first oscillator configured to generate a first oscillation signal;
 a second oscillator configured to generate a second oscillation signal having a different cycle from the first oscillation signal;
 a first address controller configured to latch an address in response to the first oscillation signal, and output the latched address when a refresh signal is enabled;

a second address controller configured to latch the address in response to the second oscillation signal, and output the latched address when the refresh signal is enabled; and a selector configured to select any one of the output of the first address controller and the output of the second address controller in response to a select signal, and output the selected output as a row hammer address.

2. The refresh control device according to claim 1, wherein the second oscillation signal has a longer cycle than the first oscillation signal.

3. The refresh control device according to claim 1, wherein the first address controller comprises:
a first enable control circuit configured to combine an active signal and the first oscillation signal and output a first enable signal;
a first address input circuit configured to selectively receive the address in response to the first enable signal;
a first register circuit configured to store an output of the first address input circuit; and
a first address output circuit configured to output the address received from the first register circuit when the refresh signal is enabled.

4. The refresh control device according to claim 3, wherein the first address controller further comprises a first latch circuit configured to latch the output of the first address input circuit for a predetermined time.

5. The refresh control device according to claim 3, wherein the first enable control circuit enables the first enable signal when both the active signal and the first oscillation signal are enabled.

6. The refresh control device according to claim 3, wherein the first address input circuit comprises a first transmission gate configured to receive the address when the first enable signal is enabled.

7. The refresh control device according to claim 3, wherein the first address output circuit comprises a second transmission gate configured to output the address received from the first register circuit when the refresh signal is enabled.

8. The refresh control device according to claim 1, wherein the second address controller comprises:
a second enable control circuit configured to combine an active signal and the second oscillation signal and output a second enable signal;
a second address input circuit configured to selectively receive the address in response to the second enable signal;
a second register circuit configured to store an output of the second address input circuit; and
a second address output circuit configured to output the address received from the second register circuit when the refresh signal is enabled.

9. The refresh control device according to claim 8, wherein the second address controller further comprises a second latch circuit configured to latch the output of the second address input circuit for a predetermined time.

10. The refresh control device according to claim 8, wherein the second enable control circuit enables the second enable signal when both the active signal and the second oscillation signal are enabled.

11. The refresh control device according to claim 8, wherein the second enable control circuit inverts the second oscillation signal and outputs a third oscillation signal.

12. The refresh control device according to claim 8, wherein the second address input circuit comprises a third transmission gate configured to receive the address when the second enable signal is enabled.

13. The refresh control device according to claim 8, wherein the second address output circuit comprises a fourth transmission gate configured to output the address received from the second register circuit when the refresh signal is enabled.

14. The refresh control device according to claim 1, wherein the second oscillator disables the second oscillation signal when an oscillation stop signal is enabled.

15. The refresh control device according to claim 1, further comprising a selection controller configured to generate the select signal.

16. The refresh control device according to claim 15, wherein the selection controller comprises:
a reset signal generation circuit configured to generate a refresh reset signal in response to the refresh signal;
an enable signal generation circuit configured to generate a select enable signal in response to a third oscillation signal which is an inverted signal of the second oscillation signal; and
a select signal generation circuit configured to output the select signal in response to a reset signal, the refresh reset signal and the select enable signal.

17. The refresh control device according to claim 16, wherein the reset signal generation circuit comprises:
a first delay circuit configured to delay the refresh signal for a predetermined time; and
a first combination circuit configured to combine the refresh signal and an output of the first delay circuit and output the refresh reset signal.

18. The refresh control device according to claim 16, wherein the enable signal generation circuit comprises:
a second delay circuit configured to delay the third oscillation signal for a predetermined time; and
a second combination circuit configured to combine the third oscillation signal and an output of the second delay circuit and output the select enable signal.

19. The refresh control device according to claim 16, wherein when the reset signal is enabled, the select signal generation circuit is activated when the select enable signal is enabled, and deactivated when the refresh reset signal is enabled.

20. The refresh control device according to claim 16, wherein the select signal generation circuit enables the select signal when an oscillation stop signal is disabled.

* * * * *